United States Patent [19]

Ostapenko

[11] Patent Number: 5,972,782
[45] Date of Patent: Oct. 26, 1999

[54] ULTRASOUND TREATMENT OF POLYCRYSTALLINE SILICON THIN FILMS TO ENHANCE HYDROGENATION

[76] Inventor: Serguei Ostapenko, 4502 Montago Bay City, Apt. 8, Tampa, Fla. 33613

[21] Appl. No.: 08/727,963

[22] Filed: Oct. 9, 1996

Related U.S. Application Data

[60] Provisional application No. 60/004,994, Oct. 10, 1995.

[51] Int. Cl.[6] .......................... H01L 21/20; H01L 21/36; H01L 21/00; H01L 21/84
[52] U.S. Cl. .......................... 438/488; 438/149; 438/162
[58] Field of Search .................................... 438/488, 162, 438/149, 758

[56] References Cited

U.S. PATENT DOCUMENTS 5,517,037  5/1996  Yamamoto ................................. 257/64

OTHER PUBLICATIONS

"Non–Contact Real Time Monitoring of Hydrogenation Process by Surface Photovoltage Technique and Enhanced Hydrogenation Due to Ultrasound Treatment in Thin Film Poly—Silicon on Glass", by Ostapenko, et al., *Proceedings of International Display Research Conference,* (Monterey), Oct. 1994, pp. 299–302.

"Enhanced hydrogenation in polycrystalline silicon thin films using low–temperature ultrasound treatment", by S. Ostapenko, et al., *Appl. Phys. Lett.* 68 (*20*), May 13, 1996, pp. 2873–2875.

"Activation of luminescence in polycrystalline silicon thin films by ultrasound treatment", by J. Koshka, et al., *Appl Phys. Lett.* 69 (*17*), Oct. 21, 1996, pp. 2537–2539.

"Ultrasound stimulated dissociation of Fe–B pairs in silicon", by S. Ostapenko, et al., *J. Appl Phys.* 77 (*10*), May 15, 1995, pp. 5458–5460.

"Increasing short minority carrier diffusion lengths in solar–grade polycrystalline silicon by ultrasound treatment", by S. Ostapenko, et al.., *Appl. Phys. Lett.,* vol. 65, No. 12, Sep. 19, 1994. pp. 1555–1557.

Ultrasound Treatment of CZ–Si with "Ring Defects", by S. Ostapenko, et al., *VII–th Symposium on Si Material Science and Technology,* (San Francisco), May, 1994, pp. 856–867.

"Mechanism of ultrasound–stimulated changes in photo-electric and luminescence properties of cadmium sulfide", by A. P. Zdebskii, et al., *Sov. Phys. Semicond.* 20(*10*), Oct. 1986, pp. 1187–1170.

Ostapenko et al, "Non–contact Real Time Monitoring of Hydrogenation Process by Surface Photovoltage Technique and Enhanced Hydrogenation Due to Ultrasound Treatment in Thin Film Poly–silicon on Glass," Proceedings of International Display Research Confere, Oct. 1994.

Ostapenko et al., "Increasing Short Minority Carrier Diffusion Lengths in Solar–grade Polycrystalline Silicon by Ultrasound Treatment," Appl.Phys.Lett., vol. 65, No. 12, pp. 1555–1557, Sep. 1994.

Ostapenko et al., "Ultrasound Stimulated Dissociation of Fe–B Pairs in Silicon," J.Appl.Phys.77 (10), pp.5458–5460, May 1995.

*Primary Examiner*—Brian Dutton
*Attorney, Agent, or Firm*—Calfee, Halter & Griswold, L.L.P.

[57] ABSTRACT

Ultrasound treatment (UST) of poly-Si thin films on glass substrates is disclosed, for improving properties of such thin films for uses such in thin-film transistor applications. Hydrogenated films subjected to UST showed a strong decrease of the sheet resistivity. UST improves the electrical homogeneity of polycrystalline silicon as confirmed by spatially resolved surface photovoltage mapping. Spatially resolved photoluminescence and contact potential difference mapping confirmed that UST effect is grain boundary related. Studies of hydrogenated thin-film transistors demonstrated remarkable UST induced improvement in transistor characteristics, especially, a reduction of leakage current by as much as one order of magnitude and a shift of the threshold voltage. All these effects are believed to result from UST enhanced hydrogenation of dangling bonds at grain boundaries in polycrystalline silicon films.

20 Claims, 7 Drawing Sheets

ULTRASOUND TREATMENT OF POLYCRYSTALLINE SILICON THIN FILMS TO ENHANCE HYDROGENATION

CROSS-REFERENCE TO RELATED APPLICATION

This application claims the benefit of prior provisional Application Ser. No. 60/004,994, filed Oct. 10, 1995.

FUNDING

Funding for this research was provided by the Department of Defense under Grant No. MDA 972-92-J-1033.

TECHNICAL FIELD

This invention relates to ultrasound treatment of polycrystalline silicon thin films grown on substrates such as glass substrates, particularly for use as thin film transistors ("TFT"), to enhance the process of hydrogenation and improve the electronic properties of such thin films and parameters of TFTs.

BACKGROUND AND SUMMARY OF INVENTION

Hydrogenation is a critical process for improving electronic properties of polycrystalline silicon (referred to herein as "poly-Si") for thin-film transistors. Proper hydrogenation has been shown to passivate traps, reduce device leakage current, and improve drive current by increasing carrier mobility. The degree of poly-Si hydrogenation is often inferred from time consuming analytical measurements or from end-of-line transistor parameter characteristics. It has also been found that poly-Si hydrogenation can be monitored in a quick, non-contact manner by surface photovoltage (SPV) measurement, which provides a convenient real-time feedback for process control. This SPV approach is relevant to the effect of the ultrasound treatment described below.

The preferred embodiment of the present invention provides enhanced hydrogenation in poly-Si thin films by means of ultrasound treatment (UST) of such thin films. Ultrasound waves propagating through a semiconductor produce lasting changes in recombination properties related to point and extended defects. It has been found that UST applied to p-type Cz-Si and solar-grade polycrystalline Si caused significant changes in the dissociation-association kinetics of metal acceptor pairs. These results suggest that coupling of ultrasound vibrations to semiconductor materials will vary properties of point and extended defects not only in compound semiconductors, but also in silicon. Stimulated by UST, processes of point defect releasing from traps as well as point defect gettering by sinks can be of particular importance for polycrystalline silicon thin films. This is explained by two reasons: (1) existence of extended lattice defects (grain boundaries and dislocations), which effectively absorb the acoustic waves; and (2) existence of mobile point defects, e.g. hydrogen, strongly interacting with extended defects.

The present invention is particularly useful in providing enhanced hydrogenation in polycrystalline silicon (poly-Si) thin films on substrates such as glass substrates, for use in thin-film transistor ("TFT") applications. Specifically, in TFT manufacturing, plasma hydrogenation is normally one of the final technological steps. According to the present invention, UST processing is designed to enhance plasma produced hydrogenation of TFTs.

One aspect of the present invention relates to the application of UST to hydrogenated poly-Si thin films, to enhance the electronic properties of such poly-Si thin films.

Another aspect of the present invention relates to the application of UST to hydrogenated poly-Si thin film transistors to improve the electronic properties of such transistors.

Still another aspect of the present invention is the mechanism by which hydrogenation and application of UST to a poly-Si film improves its electronic properties. Specifically, hydrogenation and application of UST adds hydrogen to the poly-Si film and promotes passivation of dangling Si bonds in the film, to enhance the electronic properties of the poly-Si film.

The present invention will become further apparent from the following detailed description and the accompanying drawings.

BRIEF DESCRIPTION OF THE DRAWINGS

FIG. 4($a$) and 4($b$) are SPV maps of the same poly-Si film before UST (FIG. 4($a$)) and after UST (100°, 165 min) and subsequent relaxation for 12 h at 20° C. (FIG. 4($b$));

FIGS. 9($a$)–9($d$) shows contact potential difference mapping (5 $\mu$m×5 $\mu$m) of poly-Si films before UST (9$a$) and after UST (9B), and histograms of contact potential difference CPD distribution (9$c$ and 9$d$) across the area shown in (9$a$) and (9$b$), respectively; and FIGS. 10($a$)–10($b$) shows UST reduction of leakage current (10$a$) and shift of threshold voltage (10$b$) in two poly-Si TFTs (UST parameters: $\Delta t$=15 min, T=60° C.).

DETAILED DESCRIPTION OF THE PREFERRED EMBODIMENT

As discussed above, this invention relates to improvement of poly-Si thin films, and particularly to poly-Si films on glass substrates for thin film transistor (TFT) applications. This improvement is attributable in accordance with the present invention to a substantial reduction in the concentration of dangling Si bonds in the bulk and interface of the poly-Si film. Such dangling Si bonds represent defects in the crystal structure of the film which can lead to a deterioration in different electronic properties of the film depending on its specific composition (e.g. dopants) and use. For example, in a poly-Si thin film transistor, excessive dangling Si bond concentration is reflected by a deterioration in leakage current and threshold voltage of the device.

Measurement of the concentration, and hence the reduction in concentration, of dangling Si bonds in a poly-Si film in accordance with the present invention can be done in a variety of different ways. For example, FTIR spectroscopy, electron-paramagnetic resonance, secondary ion-mass spectroscopy and other known techniques can be used for direct quantitative measurements of the dangling Si bond concentration. However, these techniques generally require specially designed samples and therefore are not suitable for in-line hydrogenation monitoring, particularly in the manufacture of flat panel displays and other similar devices.

Accordingly, it is preferable to use an indirect measurement technique to monitor reduction in dangling Si bond concentration. And, since the effect of excessive dangling Si bond concentration is different depending on the specific composition and use of the poly-Si film, the measurement technique adopted for this indirect measuring should be one which is appropriate for the specific electronic property affected. For example, one or more of the following effects, which can be directly measured, can be used for monitoring a change in dangling Si bond concentration in accordance with the present invention: 1) a dramatic reduction of poly-Si sheet resistance, 2) improvement of surface photovoltage contrast, 3) increase and homogenization of photoluminescence intensity, 4) reduction in contact potential difference contrast in a nano-scale mapping, and 5) reduction of leakage current and a shift of threshold voltage, especially in hydrogenated poly-Si thin film transistors.

The following description demonstrates how transport and recombination properties of poly-Si thin films on glass substrates for thin film transistor applications can be improved by UST.

Initially, it is noted that poly-Si films having a thickness of 1 $\mu$m or less are currently referred to as "thin films." However, as recognized by those in the art, the definition of "thin film" could change with further development of the technology. Thus, it is believed that the definition of "thin film" would be recognized as 1 $\mu$m or less at this time, but that the definition could change with future developments in the technology.

Semi-insulating as-grown Si films with thickness ranging from 0.35 to 0.55 $\mu$m were deposited at 625° C. or 550° C. on Corning 7059 glass substrates by low pressure chemical vapor deposition using $SiH_4$ pyrolysis. X-ray diffraction proved that 625° C. films had a crystallite structure with orientation (110), while the films deposited at 550° C. were amorphous. Subsequent prolonged annealing (8 to 75 h) of 550° C. caused a gradual development of the crystallite structure oriented predominantly along (111) direction. The films were selectively hydrogenated using a pattern defined by an opening in an Al mask. This enabled study of the UST effect by comparing hydrogenated ("H") with non-hydrogenated ("non-H") areas on the same film. The hydrogenation was performed at 300° C. in a plasma system operating at 100 ccm $H_2$ flow with 0.3 Torr pressure and 200 W radio frequency power for 1 to 3 hours. The plasma system used was commercially "Plasma Therm PT-700 PECVD/RIE Dual Chamber System," manufactured by Plasma Therm, Inc., St. Petersburg, Fla.

The hydrogenation efficiency was monitored by measuring the sheet resistivity using the four-point-probe method. Complimentarily, the surface photovoltage (SPV) of these films was also measured. According to the principles of SPV method, the surface potential can be modulated by photo-induced carriers, therefore, the magnitude and phase of AC voltage is a sensitive measure of bulk and surface recombination properties of material. Using chopped optical excitation with 514 nm Ar-laser line (light penetration of 0.3 $\mu$m in poly-Si) and a lock-in response measurement technique, and information regarding recombination lifetime in conditions of a strong trapping effect can be obtained. SPV measurements were performed with commercial "CMSIII" system manufactured by Semiconductor Diagnostics, Inc., Tampa, Fla., using an Ar-laser as photo-excitation source. This system is similar to that shown and described in U.S. Pat. No. 5,025,145, the disclosure of which is incorporated by reference herein.

Figure 1:
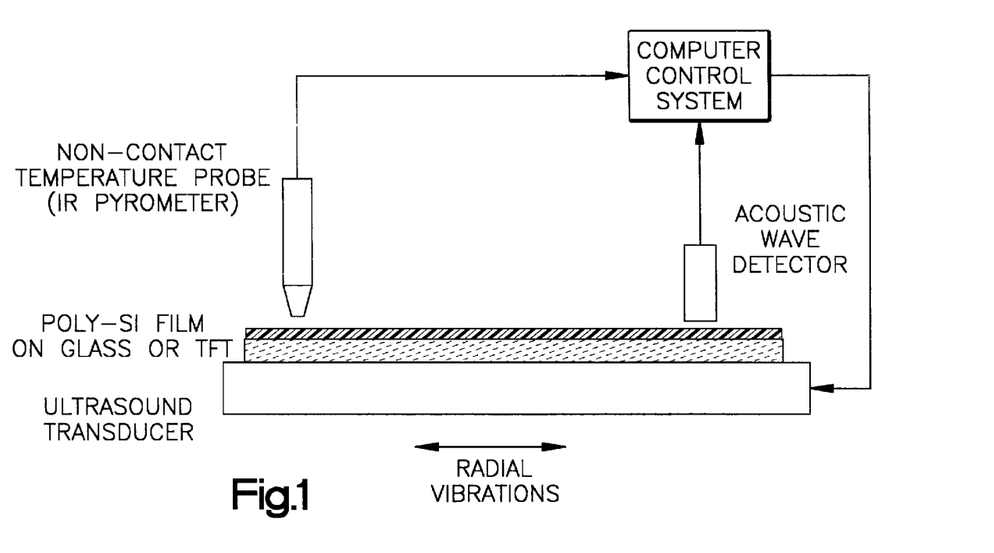
FIG. 1 is a schematic illustration of apparatus for applying ultrasound vibrations to poly-Si thin film or poly-Si thin film transistors on glass substrate.

For UST experiments, ultrasound vibrations were applied to the poly-Si sample through the glass substrate by external circular piezoceramic transducers of 1.5" or 2.9" diameter and 0.125" thickness as shown in FIG. 1. The transducers were driven by a function generator and power amplifier adjusted to the resonance frequency of the radial or thickness vibrations. Each UST can be specified by the following parameters: ultrasound mode and frequency (25 to 650 kHz); amplitude of acoustic strain generated by transducer, (typically, on the order of $10^{-5}$); temperature (20 to 120° C.); and UST time (5 to 120 min). The sample temperature during UST was measured in-situ by a remote infrared pyrometer, while the amplitude of acoustic vibrations generated into the sample was controlled by a miniature piezoelectric acoustic wave detector (FIG. 1), the Pinducer VP-1093, manufactured and distributed by Valey-Fisher Corp. Hopkinton (Mass.). UST induced changes in film properties and their post-UST relaxation were monitored by measuring poly-Si sheet resistivity and the SPV signal. Additionally, it should be noted the foregoing experiments were carried out with a glycerin layer intermediate the substrate and the transducer, to improve acoustical contact and increase transmission of acoustic vibrations from transducer to substrate. However, it is believed that it may be possible to delete the intermediate layer and provide the substrate in direct contact with the transducer.

Figure 2:
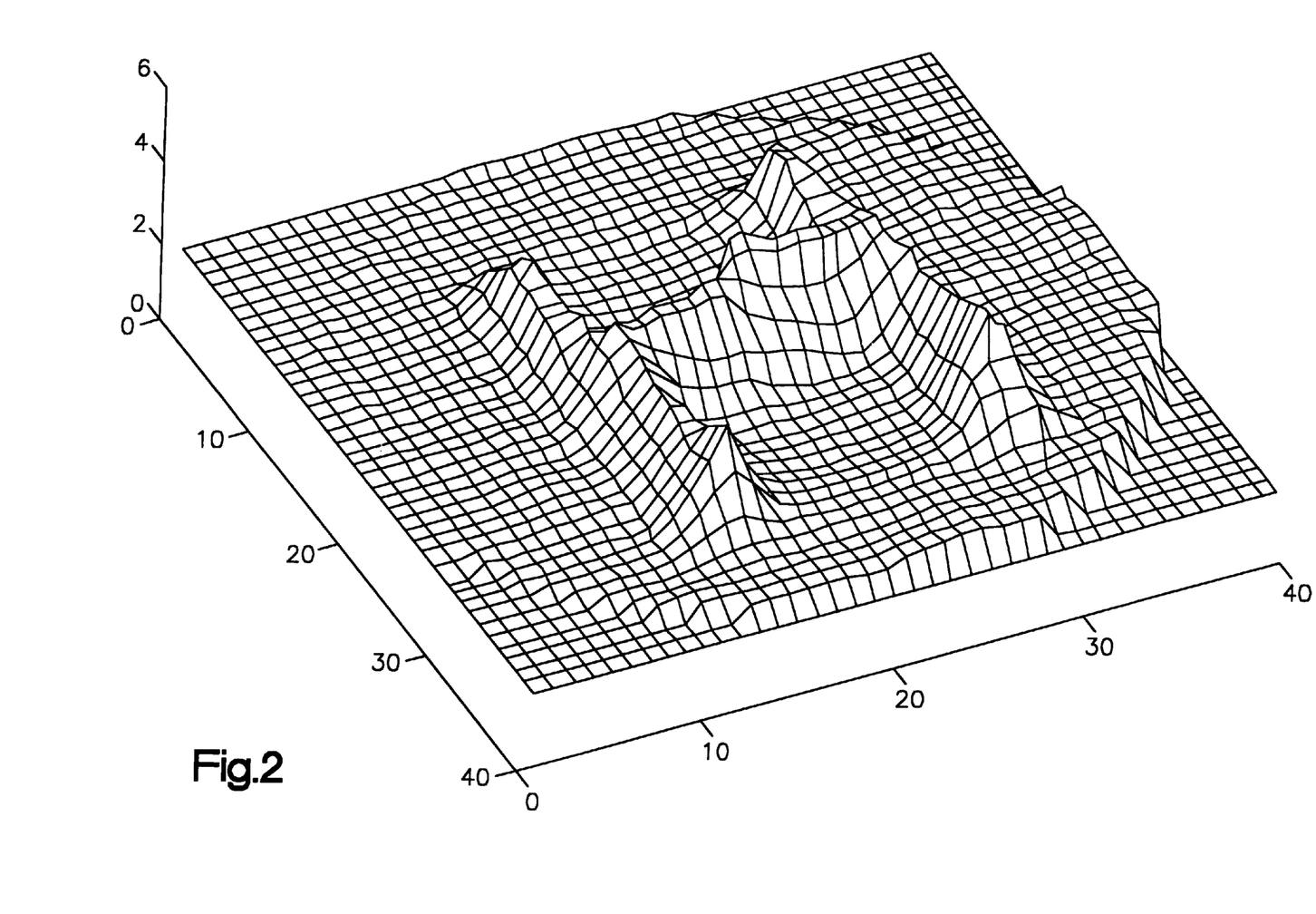
FIG. 2 is a surface photovoltage map of selectively hydrogenated poly-Si thin film on glass ("H" character is a hydrogenated area, the film deposition temperature $T_{dep}$=625° C.)

The surface photovoltage measurements show SPV signal magnitude is increased in the hydrogenated areas compared to non-hydrogenated regions of the same sample. This is demonstrated in FIG. 2 by means of an SPV map of a thin poly-Si film selectively plasma hydrogenated with a patter of the letter "H", using the Plasma Therm equipment described above. These results are consistent with the known role of hydrogenation in thin film poly-Si. The hydrogenation passivates traps, thereby reducing minority carrier recombination and as a consequent changes the SPV amplitude and phase. The four point probe resistivity measurement on the same film have shown a resistivity drop by approximately 1 order of magnitude in the H-region compared to the non-H region. This is consistent with published data on hydrogenation effect on poly-Si film resistivity. In the present work, resistivity and SPV measurements were used as two independent techniques for monitoring the hydrogenation efficiency.

It is noted that the SPV contrast between "H" and "non-H" regions of a film is gradually improved with the increase of implantation dose from $10^{12}$ to $10^{15} cm^{-2}$. The contrast in SPV map is also a function of illumination light intensity. These results are consistent with the known role of hydrogenation in thin film silicon. The hydrogen passivates traps, thereby reducing minority carrier recombination and as a consequence changes surface photovoltage signal. The SPV detection of hydrogenated areas also agrees with the observed four point probe resistivity measurement. Resistivity was reduced by approximately 1 order of magnitude in the H-region compared to the non-H region, consistent with published data.

Figure 3:
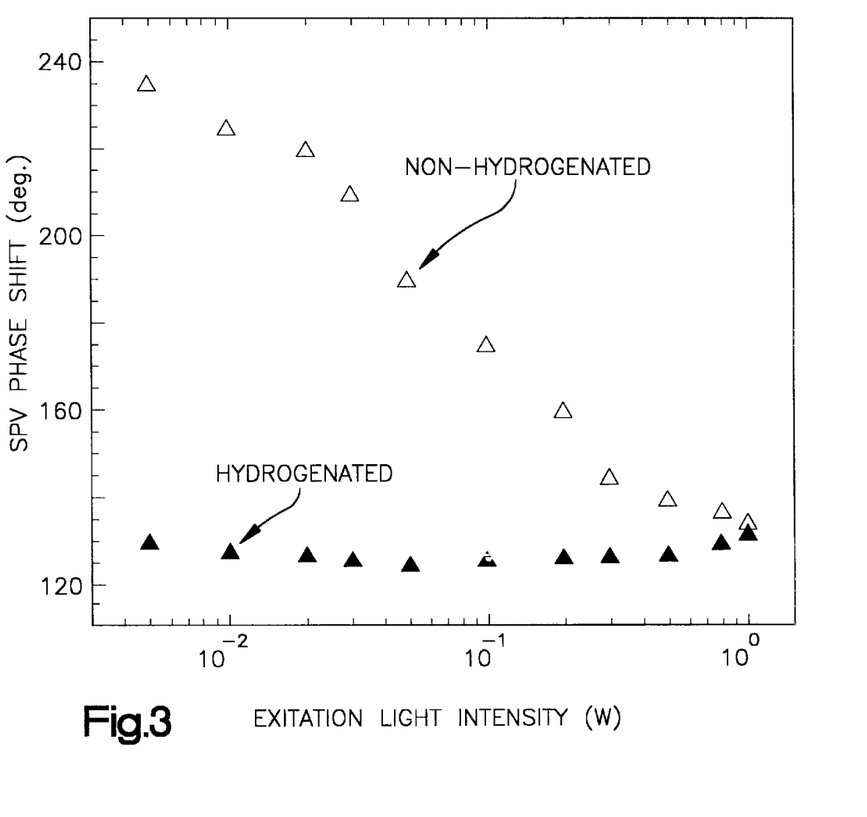
FIG. 3 is a graph illustrating dependence of surface photovoltage phase shift versus light intensity in hydrogenated and non-hydrogenated areas of a sample.

Another measure of the hydrogenation effect is the change of phase shift between the SPV signal and photoexcitation pulses. In the H-region, the phase shift is only slightly effected by the illumination intensity, while in the non-H areas a strong phase change of 75–105° at the lowest light intensity is observed (FIG. 3). It was subsequently found that this phase shift contrast disappeared following dilute HF dip of the sample to remove native oxide. From this direct experiment, it was postulated that the SPV phase shift in non-H area is related to surface traps at the native oxide-silicon interface. Within the hydrogenated region, these traps are dominantly passivated by H and not active in the recombination process, either before or after the HF treatment.

These phase-resolved SPV measurements are consistent with well known recombination processes in bulk silicon and $Si/SiO_2$ interface. In the non-hydrogenated areas the trap density is relatively high, and the trapping effect on minority carrier lifetime is substantial. The recombination efficiency of these traps is influenced by minority carrier occupation, and therefore depends upon minority carrier generation rate. At high excitation levels, the traps are occupied by minority carriers and the trapping efficiency is reduced. At lower excitation levels, trap occupation is reduced, and lifetime is increased due to strong retrapping effect. This dynamic trapping process results in a change in the ability of the modulated SPV signal to follow the excitation pulses. In the hydrogenated areas, the effective trap density is reduced by the hydrogen passivation, suppressing the SPV phase/excitation flux relationship.

Figure 4A:
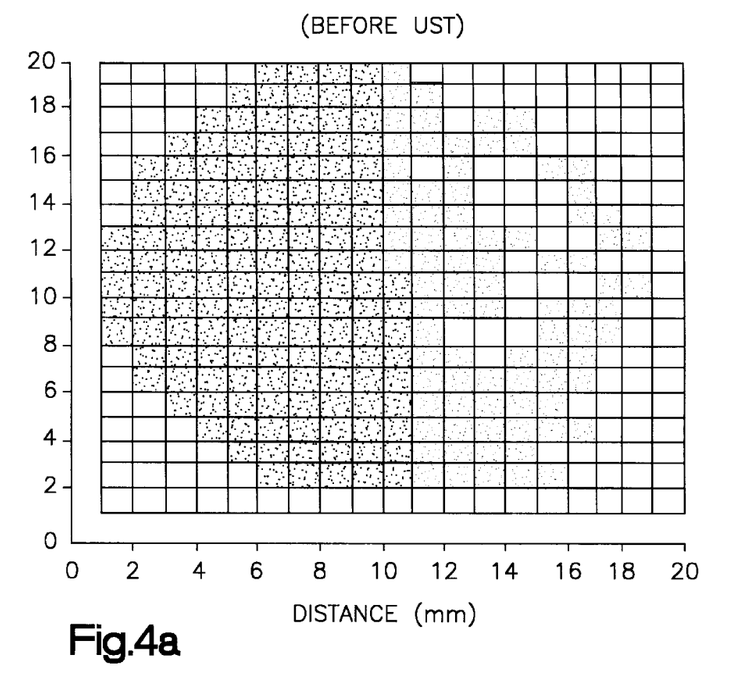
Figure 4B:
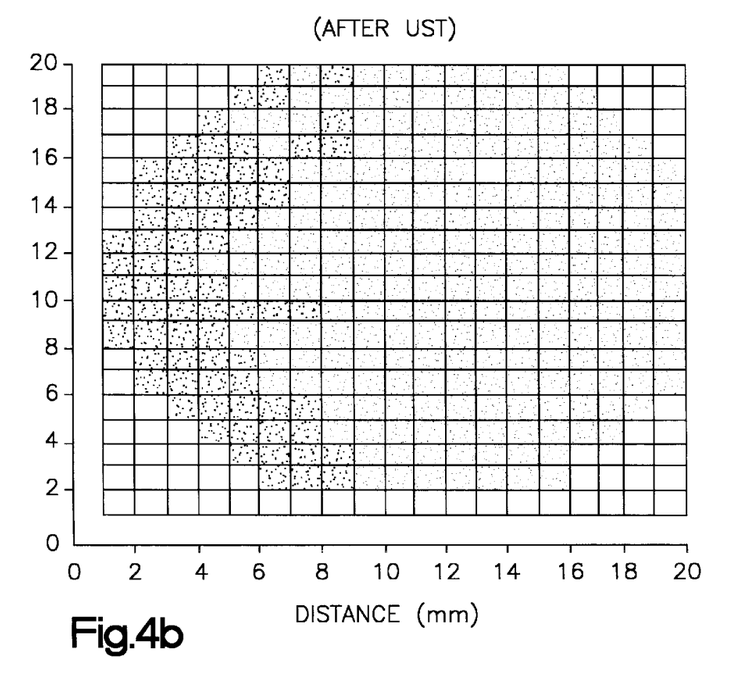

The SPV phase shift technique gives an access to the monitoring of trap distribution in the native oxide of poly-Si film. By comparing the maps in the "H" and "non-H" areas of the same sample, a strong influence of ultrasound on the process of hydrogen passivation of the oxide interface traps was noted. This can be observed by measuring SPV at low excitation light intensity, when the trapping effect is dominant (FIG. 3). The effect of penetration of the hydrogenated into the non-hydrogenated area after UST is observed as a movement of the border between "H" and "non-H" regions of a sample (FIGS. 4a, 4b). In FIGS. 4a and 4b, the right part of the map (light area) corresponds to the hydrogenated region of the film, while the left part (dark area) was not hydrogenated. Low excitation light intensity was used to monitor the hydrogen passivation of surface interface traps, and the influence of UST on the distribution of hydrogen across the film. The movement of the border between "H" and "non-H" regions of the films is shown in FIG. 4(b). By studying the post-UST room temperature relaxation it is observed that stimulated by UST process of surface trap passivation in the "non-H" area has a permanent behavior and does not show any recovery. The process of ultrasound enhanced hydrogen redistribution at the interface of poly-Si and native oxide can be attributed to: release of H from the reservoir as in the case of bulk traps followed by the low-temperature diffusion of highly mobile atomic hydrogen. A diffusion length of H° can be estimated using the diffusion coefficient of hydrogen in amorphous $SiO_2 D(H°) = 1 \times 10^{-4} \exp(-0.18/kT)$. By using the parameters of UST applied to the sample shown in FIGS. 4 (T=373, K, t=165 min) one can find the value of penetration depth for hydrogen: $X = (4Dt)^{1/2} = 1.6$ mm, which is close to the experimental value of (1–4 mm) given by a border shift between "H" and "non-H" regions in poly-Si film (FIGS. 4a,b).

Figure 5:
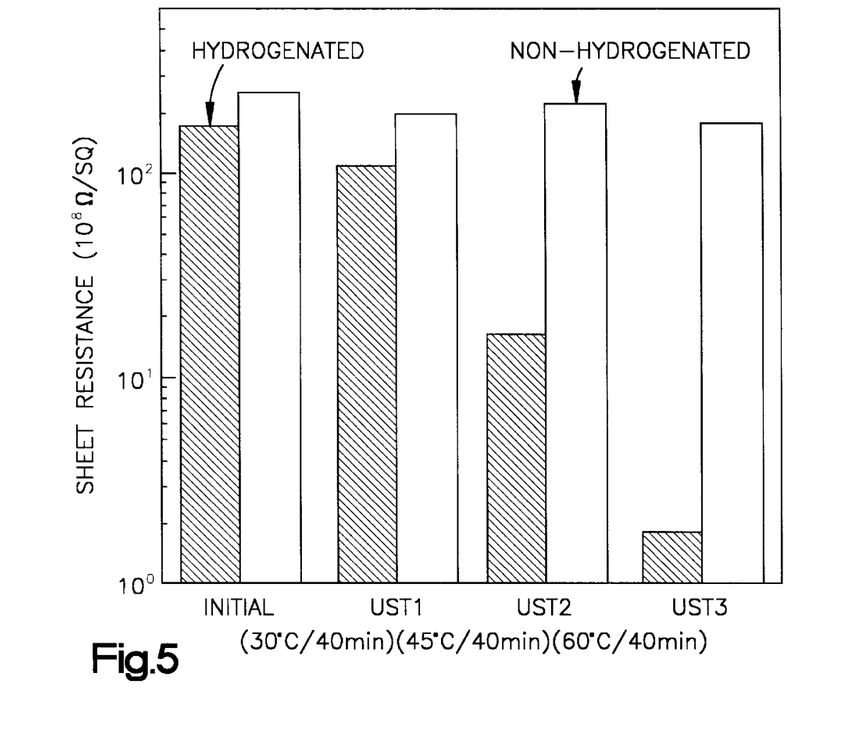
FIG. 5 is a graph illustrating the effect of an ultrasound treatment on sheet resistivity in hydrogenated poly-Si thin film compared to a non-hydrogenated film.

The results of UST on sheet resistance of hydrogenated and non-hydrogenated samples are shown in FIG. 5. The "H"- sample demonstrates a dramatic one to two orders of magnitude decrease in resistance after UST. In comparison, the same UST applied to "non-H" sample produced only 30 to 40% reduction of resistance. The UST effect is specified by a time constant of 25 min. at 55° C. This low temperature UST processing of poly-Si on glass can be specifically beneficial for thin-film transistor technology, where the temperature stability of low cost glass substrates is a critical parameter.

Figure 6:
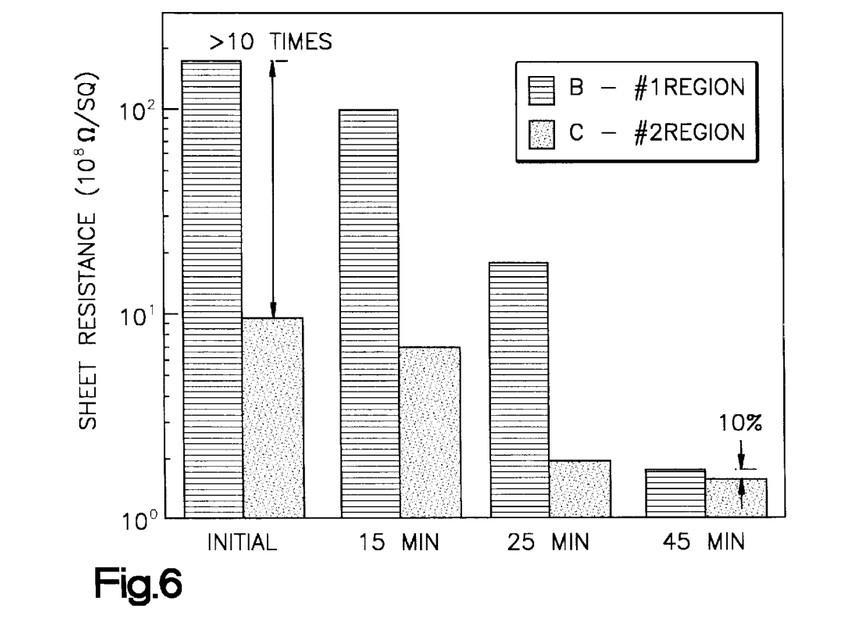
FIG. 6 is a graph illustrating improvement of resistance homogeneity in hydrogenated poly-Si thin film versus time of ultrasound treatment.

UST also improves the homogeneity of hydrogenated poly-Si films. In FIG. 6 a comparison is given between the resistivity of two different regions of the same plasma hydrogenated sample. It is obvious that UST stimulated two effects: specifically, it (a) decreased the absolute value of film resistivity, and (b) it reduced differences in resistance between film regions. In the case presented in FIG. 6, the resistivity ratio in the two regions was reduced from one order of magnitude before the UST to less than 10% after treatment. This result is confirmed by a 177-point SPV mapping (spatial resolution of 2 mm) of 2 inch diameter poly-Si film subjected to a set of consecutive UST. As shown in the following Table 1, the 177-point SPV signal standard deviation gradually decreased after UST by a factor of 2.5. Therefore, the improvement of the film homogeneity after UST is documented by both resistivity and SPV measurements.

TABLE 1

Changes in standard deviation of 177-point SPV map after UST in a poly-Si film.

| State of poly-Si | Standard Deviation (%) | Average SPV Amplitude (mV) |
| --- | --- | --- |
| Before UST | 42 | 1.32 |
| UST1 (30 min/70° C.) | 28 | 1.21 |
| UST2 (120 min/100° C.) | 24 | 1.26 |
| Relaxation (12 h/20° C.) | 17 | 1.60 |

Figure 7:
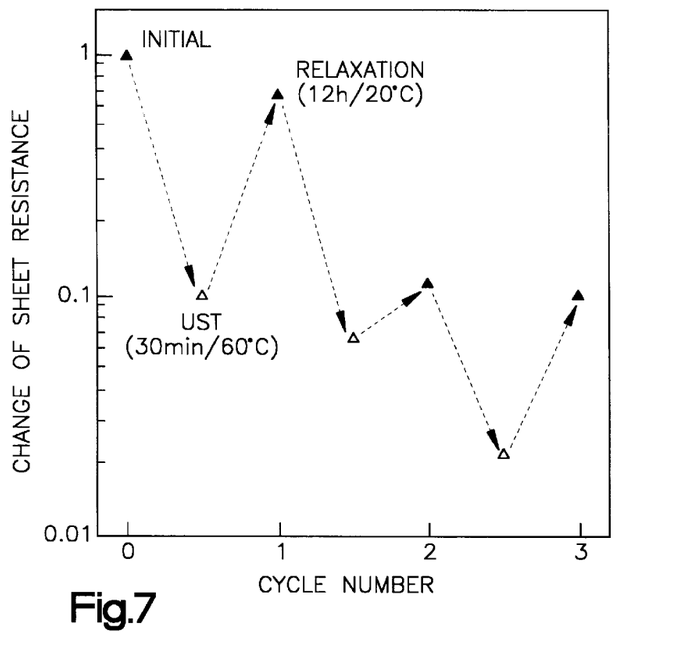
FIG. 7 is a graph illustrating stabilization of UST effect in hydrogenated poly-Si film by using cyclic UST-relaxation-UST procedure.

The transient character of UST effect and post-UST relaxation are of special concern in practical utilization of this treatment. The relaxation for 12 h at room temperature to a new, but lower than initial value of resistance had been observed for "H" samples subjected to UST as shown in FIG. 7. This relaxation process can be noticeably suppressed by cyclic UST-relaxation-UST procedure (FIG. 7). This scheme enables a permanent reduction of the sheet resistivity in hydrogenated poly-Si film by as much as one order of magnitude.

The phenomenon of the resistivity decrease due to poly-Si hydrogenation is recognized as the passivation of inter-grain boundary trapping centers by hydrogen resulting in a decrease of grain boundary barriers. Present experimental results imply that this process can be substantially enhanced by UST. It is believed the following mechanism accounts for the UST effect in poly-Si thin films. It is known that after hydrogenation of poly-Si thin films the total hydrogen concentration in the film exceeds the number of dangling Si bonds by as much as two orders of magnitude. Furthermore, it is also know that the fraction of passivated dangling Si bonds is often very low. Therefore, a significant reservoir of hydrogen is available in the hydrogenated film for the passivation of dangling Si bonds. It has been observed that this hydrogen in the reservoir is weakly bound (presumably, in the form of complexes or small H-induced platelets) and can be released by a low temperature annealing (460K) followed by rapid quenching. The process of thermal liberation of hydrogen from the reservoir has an activation energy of about 1 eV. This atomic hydrogen after fast diffusion to grain boundary regions can be captured by dangling bonds and form stable at room temperature centers. Alternatively, it can generate metastable centers at Si—Si bonds, strongly distorted by tensile stress at grain boundaries. It is known that such centers are metastable defects and show a room-temperature relaxation of resistivity change. It can be postulated that UST enhances the hydrogen liberation from the reservoir (25 min at 55° C.), presumably, by decreasing the binding energy of atomic hydrogen in the reservoir. Moreover, UST can also increase the diffusivity of atomic hydrogen by reducing the activation energy of H-diffusion. These suggestions follow examples of the established UST stimulated reduction of activation energy for dissociation of Fe-B pairs and association of Cr-B pairs in silicon stimulated by the ultrasound. The cyclic UST-relaxation-UST procedure finally brings together the released hydrogen and the dangling Si bonds at grain boundaries, by forming stable Si-H centers. This relevant stable decrease of the sheet resistance may be in fact similar to the cyclic process of low temperature annealing—light activation of dangling Si bonds reported previously in thin poly-Si film.

It has been reported recently that photoluminescence ("PL") spectroscopy allows defect monitoring in polycrystalline Si films, and is specifically sensitive to the state of film hydrogenation (see Attachment A hereto). At 4.2K the 0.9 eV PL band corresponding to band-tail recombination dominates in the luminescence spectrum of films deposited at 625° C.

Figure 8:
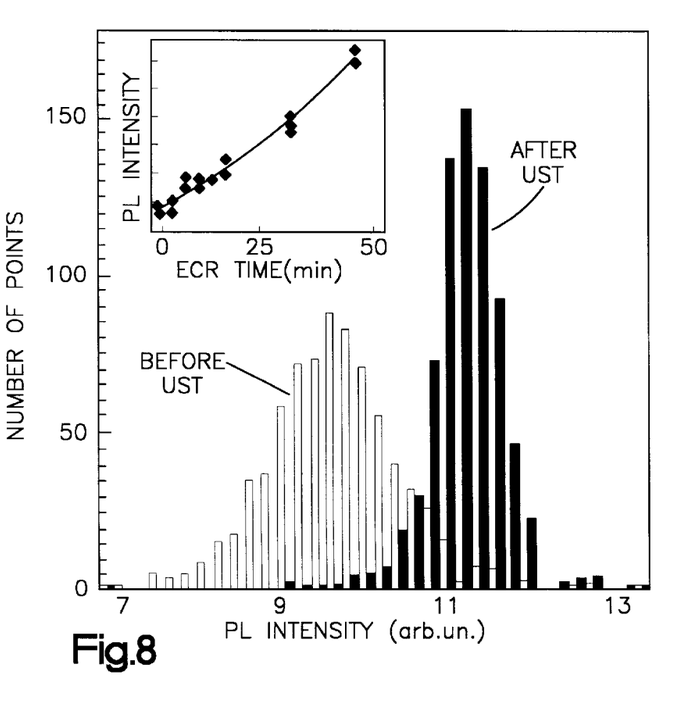
FIG. 8 is a graph illustrating UST change in distribution of room temperature photoluminescence (PL) intensity (0.75 eV) in electron cyclotron resonance (ECR) hydrogenated films (the insert shows the increase of PL with ECR hydrogenation time)

With increasing temperature, the 0.9 eV band is strongly quenched and an oxygen-related PL bands with maxima at 0.65 eV or at 0.72 eV are retained and persist at room temperature These "oxygen" PL bands intensity were used to monitor the result of hydrogenation and UST on poly-Si film properties. In FIG. 8, the increase of the 0.72 eV PL band intensity versus electron cyclotron resonance ("ECR") plasma hydrogenation time is shown. This increase of PL intensity occurs due to hydrogen passivation of non-radiative recombination centers (dangling Si bonds) at grain boundaries. The PL mapping technique with a resolution of 100 $\mu$m was used to monitor the distribution of recombination centers before and after UST. The results are presented in FIG. 8 as two histograms of exactly the same hydrogenated film area prior to and immediately after UST. The average PL intensity after UST exhibits an additional 25–30% increase and also narrowing by a factor of two of the half-width of the PL histogram. This result is consistent with the UST-induced improvement of resistance homogeneity in FIG. 6.

Figure 9A:
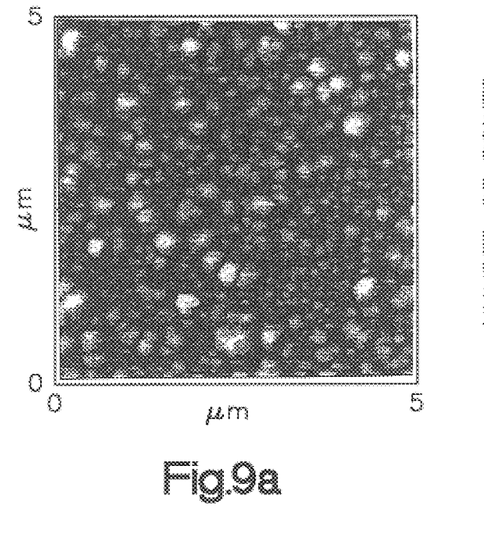
Figure 9B:
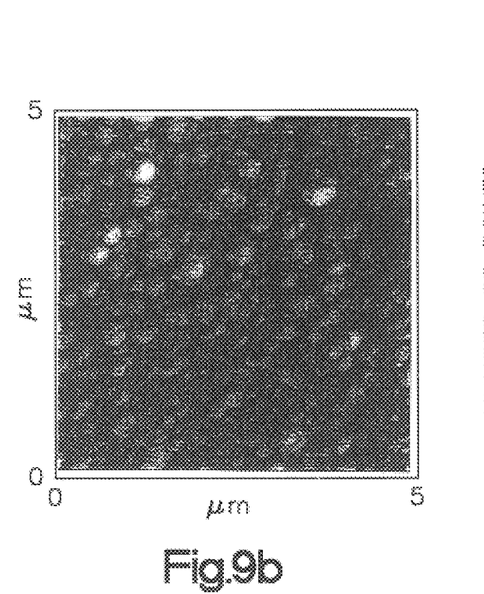
Figure 9C:
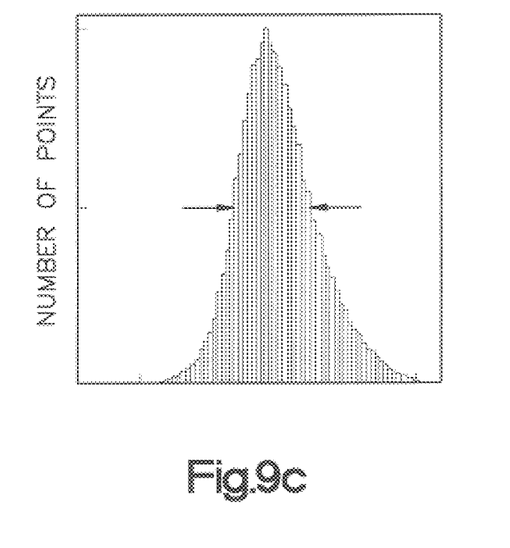
Figure 9D:
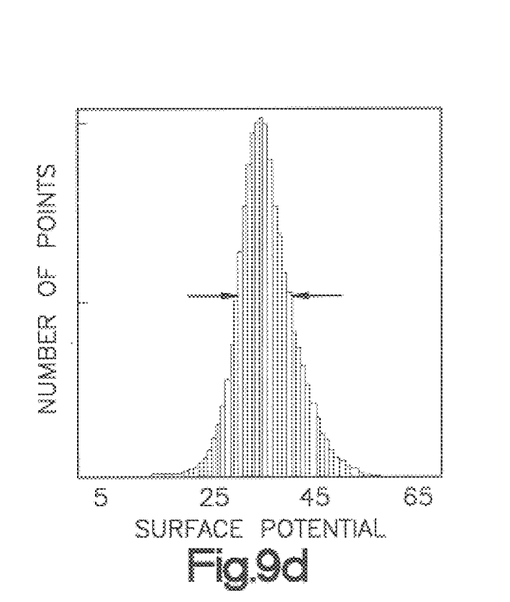

Another experimental evidence of UST effect is given by contact potential difference (CPD) mapping at 5$\mu$-by-5$\mu$film area using an atomic force microscope with a resolution of 20 mm. The results are presented in FIG. 9a for the film subjected to 30 min ECR hydrogenation. CPD contrast originates from the charge trapped at grain boundary defects in poly-Si. The contrast of a CPD map is gradually reduced with hydrogenation time due to passivation of the grain boundary defects. The UST was performed on the hydrogenated film and compared CPD contrast before and after treatment (FIGS. 9a and 9b). The measurement condition of CPD mapping was precisely maintained in both cases, in particularly, the elevation of a tip above sample surface. The reduction of the CPD contrast after UST is seen and quantified by a narrowing of the contact potential histogram in FIG. 9d as compared to FIG. 9c. It was noticed that at samples exposed with ECR plasma treatment more than 45 min the UST effect on CPD contrast was negligible. The UST reduction of nano-scale CPD mapping contrast provides a direct proof of ultrasound enhanced hydrogenation of grain boundary defects in poly-Si films where plasma hydrogenation was not completed.

Figure 10A:
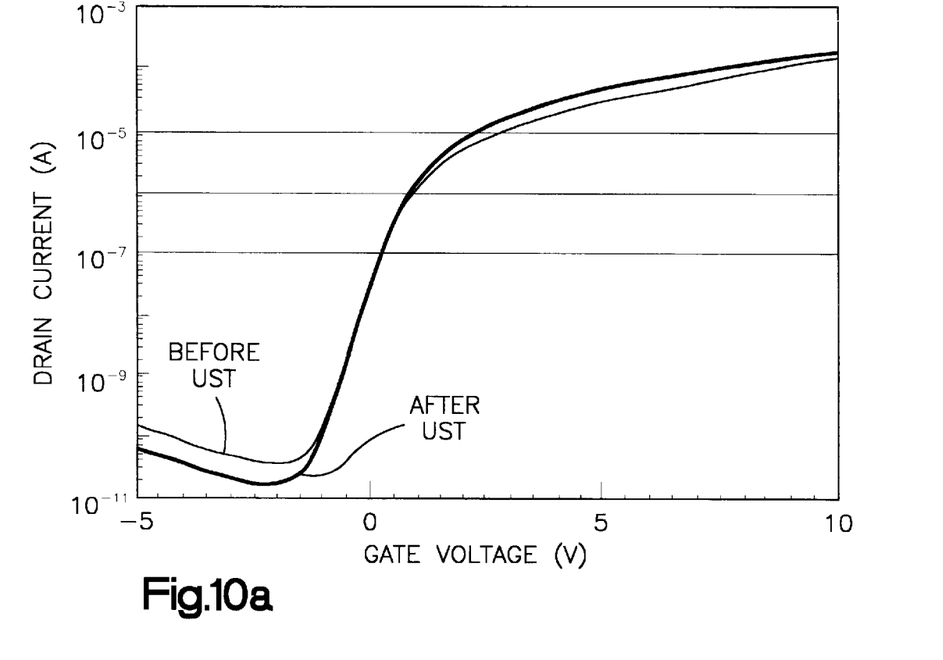
Figure 10B:
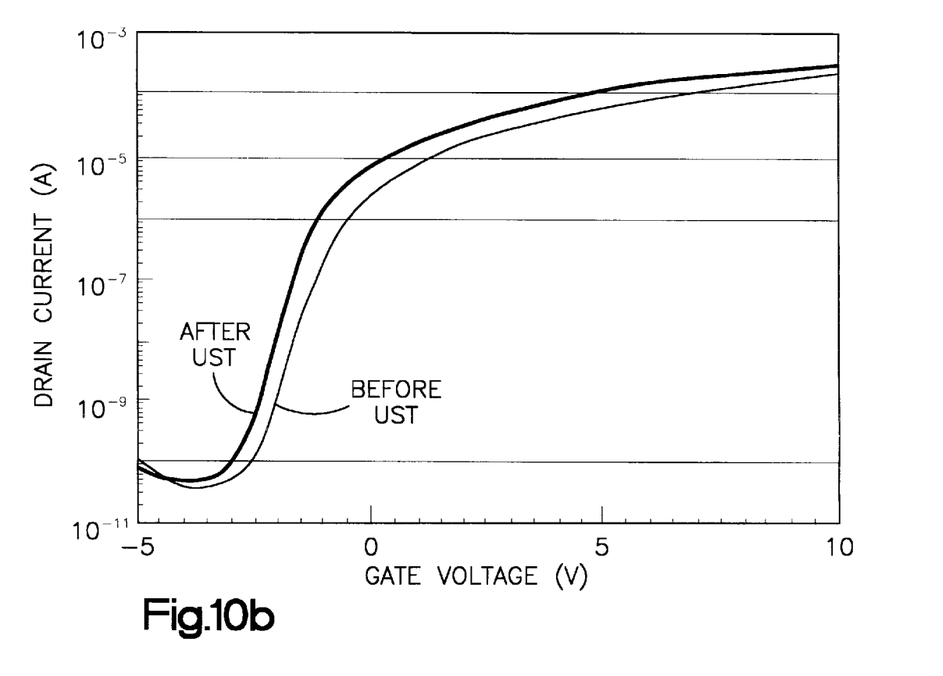

Finally, UST has been applied to poly-Si TFTs designed at the facilities of the University of South Florida and at the David Sarnoff Research Center. It has been found that 3 to 8 times reduction of TFTs leakage current and a shift of threshold voltage by as much as 0.5 V could be achieved as shown in FIG. 10.

It is well-known that both values of the leakage current and of the threshold voltage are controlled by the density of dangling bonds in transistor's p-n junction and at the gate oxide interface. Both parameters of poly-Si thin film transistor—leakage current and threshold voltage-can be partially improved using conventional plasma hydrogenation technique. Experimental data presented in FIG. 10 strongly suggest that UST can promote a substantial improvement of transistor's hydrogenation by means of accomplishing the passivation of dangling Si bonds with atomic hydrogen in the p-n junction region and at gate oxide interface. UST improvement of the transistor's parameters is consistent with UST effect on resistance, surface photovoltage, photoluminescence and contact potential difference study in hydrogenated poly-Si films described above.

SUMMARY

As seen from the foregoing description, ultrasound treatment (UST) applied to hydrogenated poly-Si film provides the change of transport and recombination properties relevant to TFT applications. The process shows a relaxation behavior, but can be stabilized by cycling consecutive ultrasound treatment and relaxation. Ultrasound enhanced hydrogenation can be explained as UST stimulated release of atomic hydrogen from the electrically nonactive state (H-reservoir) followed by subsequent hydrogen trapping at dangling Si bonds in grain boundary regions and surface interface states. This UST mechanism can be responsible for the reduction of leakage current presently observed for commercial hydrogenated thin film transistors. By analogy with other semiconductors with grain boundaries, dislocations and point defects, UST may be an alternative (or complimentary) technique to improve the properties of polycrystalline silicon thin films and thin-film transistors for active matrix liquid crystal display application.

While a preferred version of the invention, as applied for improving hydrogenation of poly-Si thin films on glass substrates, has been described, it is believed that the principles of this invention can also be applied to other forms of thin films and other types of substrates. For example, it is believed that the principles of this invention can be applied to compound and ternary semi-conductor thin films on substrates such as glass, quartz, bulk semi-conductor wafer and sapphire materials, each of which is substantially transparent to ultrasound vibrations (quartz in particular is a preferred alternative to glass where high temperature performance of the substrate is required). Additionally, it is contemplated that the principles of this invention will be useful up to 10 Mhz UST by resonance frequency by using different transducer sizes. Still further, while the invention is particularly useful with thin films for semi-conductor applications (e.g., 1 μm and less in thickness), its principles are believed to be applicable to poly-Si films generally, for other electronic applications. For example, the principles of the invention are believed applicable to poly-Si films with greater than 1 μm thickness which are useful in solar cell applications. With the foregoing disclosure in mind, the manner in which the invention can be applied to, or used with, other thin film type of applications, will be apparent to those skilled in the art.

We claim:

1. A method for improving the electronic properties of a hydrogenated poly-Si film comprising subjecting said film to a first ultrasound treatment.

2. The method of claim 1, wherein said first ultrasound treatment is carried out for a time sufficient to reduce the concentration of dangling Si bonds in said film.

3. The method of claim 2 further comprising
   (a) terminating said first ultrasound treatment,
   (b) allowing said film to relax for a first period of time after termination of said first ultrasound treatment whereby said concentration of dangling Si bonds in said film increases, and
   (c) subjecting said film to a second ultrasound treatment whereby said concentration of dangling Si bonds in said film is reduced permanently.

4. The method of claim 2 further comprising
   (a) terminating said first ultrasound treatment,
   (b) allowing said film to relax for a first period of time after termination of said first ultrasound treatment whereby said concentration of dangling Si bonds in said film substantially increases, and
   (c) subjecting said film to a second ultrasound treatment whereby said concentration of dangling Si bonds in said film is substantially reduced permanently.

5. The method of claim 1, wherein said film is carried on a substrate which is substantially transparent to ultrasound energy.

6. The method of claim 5, wherein said substrate is glass.

7. The method of claim 5, wherein said substrate is quartz.

8. The method of claim 1, wherein said film is a thin film.

9. The method of claim 8, wherein said thin film comprises a portion of a transistor.

10. The method of claim 1, wherein said first ultrasound treatment is carried out for a time sufficient to substantially reduce the concentration of dangling Si bonds in said film.

11. The method of claim 1, wherein said film is carried on a glass substrate.

12. The method of claim 1, wherein said film is carried on a quartz substrate.

13. The method of claim 1, wherein said film is carried on a sapphire substrate.

14. The method of claim 1, wherein said film is carried on a bulk semi-conductor wafer substrate.

15. The method of claim 1 further comprising:
   (a) terminating said first ultrasound treatment,
   (b) allowing said film to relax for a first period of time after termination of said first ultrasound treatment,
   (c) subjecting said film to a next ultrasound treatment whereby said concentration of dangling Si bonds in said film is reduced,
   (d) terminating said next ultrasound treatment,
   (e) allowing said film to relax for a next period of time after termination of said next ultrasound treatment, and
   (f) performing said steps (c) through (e) again.

16. The method of claim 15 wherein said film has associated therewith an initial sheet resistance before said first ultrasound treatment is performed, wherein said film has associated therewith a relaxed sheet resistance after said (e) is performed, and wherein the relaxed sheet resistance of said film after the last step (e) is about an order of magnitude less than the initial sheet resistance.

17. The method of claim 15, wherein said film has associated therewith an initial sheet resistance before said first ultrasound treatment is performed, wherein said film has associated therewith a relaxed sheet resistance after each said stem (e) is performed, and wherein the relaxed sheet resistance of said film after the last step (e) is more than an order of magnitude less than the initial sheet resistance.

18. The method of claim 15, wherein ultrasound followed by relaxation are performed a number of times to permanently and substantially reduce the concentration of dangling is bonds in said film.

19. A method for passivating dangling Si bonds in poly-Si film comprising hydrogenating the poly-Si film and subjecting the poly-Si film to ultrasound treatment.

20. A method for improving passivation of the dangling Si bonds in a poly-Si film subjected to hydrogenation, said method comprising subjecting said film to ultrasound treatment.

* * * * *

UNITED STATES PATENT AND TRADEMARK OFFICE
CERTIFICATE OF CORRECTION

PATENT NO. : 5,972,782
DATED : October 26, 1999
INVENTOR(S) : Serguei Ostapenko

It is certified that error appears in the above-identified patent and that said Letters Patent is hereby corrected as shown below:

<u>Title page,</u>
Item [73], the Assignee should be identified as follows:

-- [73] University of South Florida
Tampa, Florida US --.

Signed and Sealed this

Twenty-fifth Day of June, 2002

*Attest:*

*Attesting Officer*

JAMES E. ROGAN
*Director of the United States Patent and Trademark Office*